(12) United States Patent
Bellam

(10) Patent No.: US 6,996,513 B2
(45) Date of Patent: Feb. 7, 2006

(54) METHOD AND SYSTEM FOR IDENTIFYING INACCURATE MODELS

(75) Inventor: Peter Bellam, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 884 days.

(21) Appl. No.: 09/878,164

(22) Filed: Jun. 7, 2001

(65) Prior Publication Data

US 2002/0022950 A1 Feb. 21, 2002

(30) Foreign Application Priority Data

Jun. 8, 2000 (GB) .................................. 0014038

(51) Int. Cl.
*G06F 17/50* (2006.01)
(52) U.S. Cl. ..................... 703/14; 714/740; 716/5; 716/11
(58) Field of Classification Search ............... 703/14, 703/13, 15; 364/490; 716/11, 4, 5; 708/3; 714/740; 379/399.01
See application file for complete search history.

(56) References Cited

U.S. PATENT DOCUMENTS

| | | | | |
|---|---|---|---|---|
| 4,792,913 A | * | 12/1988 | Buckland et al. ............... | 708/3 |
| 5,297,066 A | * | 3/1994 | Mayes .......................... | 703/14 |
| 5,426,770 A | * | 6/1995 | Nuber .......................... | 703/15 |
| 5,463,563 A | * | 10/1995 | Bair et al. ...................... | 716/11 |
| 5,481,484 A | * | 1/1996 | Ogawa et al. ................. | 703/14 |
| 5,557,672 A | * | 9/1996 | Perry et al. ............ | 379/399.01 |
| 5,822,567 A | * | 10/1998 | Takeuchi ..................... | 703/14 |
| 5,920,830 A | | 7/1999 | Hatfield et al. | |
| 5,991,522 A | * | 11/1999 | Shoen ............................ | 716/4 |
| 6,230,114 B1 | * | 5/2001 | Hellestrand et al. .......... | 703/13 |
| 6,230,294 B1 | * | 5/2001 | Saito ........................... | 714/740 |
| 6,560,757 B1 | * | 5/2003 | Ballam .......................... | 716/5 |
| 6,785,642 B1 | * | 8/2004 | Ballam ........................ | 703/14 |
| 6,813,597 B1 | * | 11/2004 | Demler ........................ | 703/14 |
| 6,847,926 B1 | * | 1/2005 | Ballam ........................ | 703/14 |
| 6,912,494 B1 | * | 6/2005 | Ballam ........................... | 703/4 |

FOREIGN PATENT DOCUMENTS

| | | |
|---|---|---|
| EP | 0 508 075 A23 | 10/1992 |
| GB | 2 362 728 A | 11/2001 |
| GB | 2 363 214 A | 12/2001 |

OTHER PUBLICATIONS

Eduardo L. Acuna, "Simulation techniques for Mixed ANalog/Digital Circuits" IEEE Journal of solid-state Circuits vol. . . . 25, No. 2 Apr. 1990. pp. 353-363.*

Goblick et al., T. Analog Source Digitization: A Comparison of Theory and Practice, IEEE Transactions on Information Theory, vol. 13, No. 2, Apr. 1967, pp. 323-326.*

(Continued)

*Primary Examiner*—Russell Frejd
(74) *Attorney, Agent, or Firm*—Lisa K. Jorgenson; James H. Morris; Wolf, Greenfield & Sacks, P.C.

(57) ABSTRACT

A method and system for identifying an inaccurate model of a hardware circuit includes the steps of simulating a digital model and an analogue model of the circuit to provide first and second sets of simulation results respectively. For each result in the first and second sets of simulation an integer value is determined which represents that result. The integer values are stored in first and second sets of comparison results respectively and the sets of comparison results are compared. An output signal indicating that at least one of the models is inaccurate is produced if the comparison results contradict.

17 Claims, 2 Drawing Sheets

OTHER PUBLICATIONS

Ghosh et al., A. Formal Vertification of Synthesized Mixed Signal Designs Using *BMDs*, IEEE 13th International Conference on VLSI Design, Jan. 2000, pp. 84-90.*

Maulik et al., P.C. Integer Programming Based Topology Selection of Cell-Level Analog Circuits, IEEE Transactions on Computer-Aided Design of Integrated Circuits and Systems, vol. 14, No. 4, Apr. 1995, pp. 401-412.*

Standard Search Report from United Kingdom application No. 0014038.4.

Dumlugol D. et al., "Analog Modeling Using Event-Driven HDL's" Proceedings Of The Seventh International Conference on VLSI Design (Cat. No. 94$^{TH}$0612-2), Proceedings of 7$^{th}$ International Conference on VLSI Design, Calcutta, India, Jan. 5-8, 1994, pp. 53-56.

Peralias E., et al., "A VHDL-based methodology For The Design and Verification of Pipeline A/D Converters" Proceedings Design, Automation and Test In Europe Conference and Exhibition 2000 (Cat. No. PR00537), Proceedings of Meeting On Design Automation and Test In Europe, Paris, France, Mar. 27-30, 2000, pp. 534-538.

British Search Report from United Kingdom priority application No. 0014038.4, filed Jun. 8, 2000.

* cited by examiner

METHOD AND SYSTEM FOR IDENTIFYING INACCURATE MODELS

BACKGROUND OF THE INVENTION

1. Field of the Invention

The present invention relates to a method of identifying an inaccurate model of a hardware circuit and in particular but not exclusively, to an inaccurate hardware description language (HDL) model which involves analog and digital signal types.

2. Discussion of the Related Art

In the past during mixed signal IC device or "chip" development, testing departments have had to wait until a device has been reduced to silicon before functional tests can be performed. In view of the increase in the general requirements for mixed signal (using digital and analog signals) chips and their shrinking product shelf life, the need to reduce development time has risen accordingly. By testing IC device designs prior to reduction to silicon overall development times can be reduced considerably. This means that a device can be brought to market more quickly.

A number of test simulators are known which allow test departments to test how a device will function as soon as a preliminary design is completed. This can be prior to the reduction to silicon of the device.

One type of test simulator is an analog simulator which may be used for non-linear DC, non-linear transient and linear AC analysis. SPICE is an example of an industry standard general-purpose analog circuit simulator. A development of the SPICE simulator is the ELDO simulator which provides the functionality, performance and accuracy of SPICE-level simulation along with improved algorithms which allow more complex circuits to be simulated and also provides a mixed signal simulation capability.

Analog simulators, as the name suggests, allow simulation of a hardware cell being tested at the analog signal level. The simulator provides performance results through the whole range of analog input signals and allows for voltage sweeps. In other words, the cell is tested over a wide range of voltage values, the voltage values being for example applied as inputs. As a result analog simulators provide very accurate descriptions of the designed device operation. However simulation times can be prohibitively protracted especially when a design comprises many thousands or hundreds of thousands of cells to be simulated.

As a solution to the task of describing circuits of such large scale, digital simulators have been developed. Numerous digital simulators have been developed to model the behaviour of circuitry described using a hardware description language (HDL). HDL is a programming language which has been designed and optimised for simulating and thereby describing behaviour of digital circuitry. HDL allows electrical aspects of circuit behaviour to be precisely described. However since only digital signals (which have one of two states) are simulated simulation time scales are much reduced. Additionally, only changes of logic level trigger an evaluation of the effect. A specific example of HDL is the very high speed integrated circuit HDL known as VHDL.

HDL models typically provide a behavioural description of the circuitry of the designed device which can be synthesised into a net list which includes circuit diagrams of the device saved in textual form. In other words, the circuitry of the device is broken down into cells or small circuit portions, each of which has a known behaviour. These cells or small circuit portions are listed in the net list. Operation of the device is simulated by stimulating the net list by the application of a test bench. Test benches are HDL descriptions of circuit stimulus. The outputs of the cell in response to stimulus are compared with expected outputs to verify the behaviour of a circuit over time. The verification results may be analysed to establish how the circuit has functioned.

In order to decrease the simulation times it is therefore advantageous to use a digital simulator of a hardware cell or circuit. However in order to check that the digital model used is operating correctly and therefore accurately a comparison is initially made between the results from the digital model of a test circuit with the results obtained by simulating the same test circuit with an analog model. If both models of the same hardware cell produce identical results when the cell's operation is simulated, it is an indication that the models are themselves accurate.

One problem with such a comparison of results is that whilst any digital model of a hardware cell will simulate in digital format what the cell is designed to do (or what a designer wants the cell to do) an analog model will actually model what the cell does ie how it operates under different input and output conditions. In some instances the two effects are not equal. This is because the ideal state modelled by a digital model is seldom attained in practice, as modelled via the analog simulator. In fact an analog model may well provide results which vary slightly from the ideal digital model. In such a situation when a strict comparison of results of the digital and analog models is made any results which are even slightly different will indicate that at least one of the models is inaccurate and the test will fail. As a result models which are actually accurately and correctly functioning will indicate an error when a strict comparison is made between them.

Another problem is that prior systems which have allowed the results from an analog model of a hardware cell to be compared with those of a digital cell have not allowed the tool to verify mixed signal type applications. These are occasions, such as the modelling of an analog to digital converter (ADC) or digital to analog converter (DAC), in which real data types and abstract data types are required. Real data types are for example floating point data types. Also rational numbers can represent real data types. Essentially real data types are able to approximate real numbers both rational and irrational. The real data type is thus a number which can contain a fractional part. Abstract data types are described in more detail hereinafter.

VHDL supports many abstract data types which are used to describe different signal strengths or commonly used simulation conditions such as unknowns and high-impedance conditions. These non-standard data types have been adopted by the IEEE as standard 1164. Such data types are not applicable to analog simulators which require true analog signals rather than abstract data types.

It is an aim of embodiments of the present invention to at least partly mitigate the above problems.

SUMMARY OF THE INVENTION

According to a first aspect of the present invention there is provided a method of identifying an inaccurate model of a hardware circuit comprising the steps of simulating a digital model and an analog model of the circuit to provide first and second sets of simulation results respectively, for each result in the first and second sets of simulation results determining an integer value representing that result and storing the integer values in first and second sets of comparison results respectively, comparing the sets of comparison results, and providing an output signal indicating that at least one of the models is inaccurate if the comparison results contradict.

Preferably said step of simulating a digital model comprises the steps of applying at least one input signal having a first signal type, to an input of the model, outputting at least one output signal, having a second signal type, from an output of the model, whereby said input and output signal are mixed signal types, one of the signal types being a digital signal and the other signal type being an analog signal.

Conveniently the method further comprises the steps of prior to said step of comparing results modifying the integer values in the first set of comparison results by adding a tolerance factor to and subtracting the tolerance factor from the integer value to thereby obtain a respective maximum and minimum acceptance value, for each integer value, defining a range of acceptable results between the maximum and minimum acceptable value and storing these ranges as a set of toleranced results, comparing range results in the set of toleranced results with corresponding results in the second set of comparison results, and providing the output signal according to whether a result in the second set of comparison results falls within its corresponding range from the set of toleranced results.

Advantageously the method further comprises the steps of prior to said step of comparing results, modifying the integer values in the first set of comparison results by adding a correction factor to each value, comparing results in the modified set of comparison results with corresponding results in the second set of comparison results, and providing the output signal if the modified set and second set of results contradict.

According to a second aspect of the present invention, there is provided a system for identifying an inaccurate model of a hardware circuit comprising means for simulating a digital model of the circuit and an analog model of the circuit to provide first and second sets of simulation results respectively, for each result in the first and second sets of simulation results, means for determining an integer value representing that result, means for storing said integer values as first and second sets of comparison results respectively, means for comparing the sets of comparison results, and means for providing an output signal indicating that at least one of the models is inaccurate if the comparison results contradict.

According to a third aspect of the present invention there is provided a method of identifying an inaccurate model of a hardware circuit comprising the steps of:

simulating a digital model and an analog model of the circuit to provide first and second sets of simulation results respectively;

for one of said sets of simulation results introducing a tolerance factor to provide a set of toleranced results;

comparing the set of toleranced results with the other set of simulation results; and providing an output signal indicating that at least one of the models is inaccurate if the comparison step indicates the values of the other set of simulation results and the toleranced results contradict.

Embodiments of the present invention provide the advantage that comparisons of results from an analog model and results from a digital model of a hardware cell can be made automatically. Also a tool which can carry out the comparison is provided with the ability to distinguish between inaccurate models of the hardware cell and models of the cell which differ in results by an acceptable deviation.

Further embodiments of the present invention provide a tool with the ability to handle both real values data and abstract data types.

An embodiment of the present invention will now be described by way of example only with reference to the accompanying drawings in which:

DETAILED DESCRIPTION

VHDL can describe the behaviour and structure of electronic systems in general and is suited as a language to describe the structure and behaviour of digital electronic hardware designs ie hardware cells. A cell is typically a relatively small part of the overall circuit design. Such device design is described in the VHDL language using the concept of a design entity. Each design entity is divided into two parts, the entity declaration and the architecture body. The entity declaration describes the external interface or connections to the design entity. The architecture body represents the internal description of the design entity such as its structure, behaviour or both.

Figure 1:
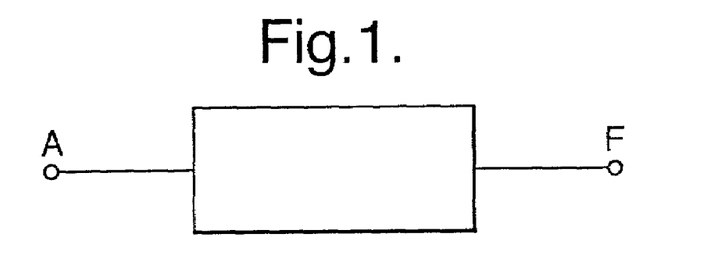
FIG. 1 illustrates an inverter logic gate.

FIG. 1 illustrates an inverter (INV) gate and it will now be described in VHDL. Considering the INV gate as a single cell, a single input pin and single output pin are required. Power and ground pins are not required to be defined.

The code in which such an inverter gate would be described in VHDL is

```
1. /*VHDL code for INV gate*/
2. library IEEE
3. use IEEE.STD_LOGIC_1164.all;
4. entity INV is
5. port (
6. A: in STD_LOGIC;
7. F: out STD_LOGIC
8. );
9. end INV;
10. architecture VI of INV is
11. begin
12. F <= not (A) after T;
13. end VI
14. /*end of VHDL code
```

Line 1 is simply a comment which allows the user to make notes referring to the code as a memory aid. The /* and */ notation indicate the start of a comment and the end of the comment respectively. This instructs the compiler to ignore the line of VHDL as the first line does not contain instructions for the compiler.

Lines 2 and 3 are a library clause (library IEEE) and a use clause (use IEEE.STD_LOGIC_1164. all;) respectively. These provide the design entity INV with access to all the names declared in the package STD_LOGIC_1164 stored in the library IEEE and particularly in the data type STD_LOGIC.

The data type of a pin sets out the values of different signal strengths and signals which may flow through the pin.

VHDL supports many such data types which are of an abstract nature including unknowns and high impedance. In order to cater for such abstract values a standard, numbered 1164, has been adopted by the IEEE. This standard defines a standard package containing definitions for a standard 9-valued data type. The standard data type is called standard logic and the IEEE 1164 package is sometimes referred to as the standard logic package or MVL 9 (for multi-value logic 9 values). The standard also defines the logical operations for theses data types, for example the NOT operation.

Each of the nine states of the IEEE 1164 standard logic package are explained below.

'U': This represents a strong unknown, that is as an input a 'U' indicates anything from a strong low to a strong high. If a 'U' is an output nothing has modified the outputs.

'X': This also represents a strong unknown and can be anything from a strong low to a strong high signal. In particular 'X' on an output can indicate that an error has occurred as the signal has passed through the model.

'-': This also represents a strong unknown and as such can be anything from a strong low to a strong high signal. This is sometimes referred to as NOT 'X'. It can provide a good logic level but it is a don't care state where its actual value is unimportant.

'W': This state is a weak version of the 'X' data type noted above.

'L': This data type represents a weak low, that is a low signal having a weak drive strength. This state can also represent a charge storage when used as an output state.

'H': This is exactly the same as an 'L' however in the opposite sense, that is say it represents a weak high.

'0': This is a strong low which can be input directly into a model.

'1': This is a strong high and is the same as a 0 but in the opposite sense.

'Z': This represents a high impedance signal and when used as an input it means nothing drives the node.

Referring back to the VHDL description of the invention, line 4 provides an arbitrary level to the design entity. This line starts the definition of a new VHDL design unit. Because the library and use clauses are written before the entity declaration they do not begin the VHDL description of the design unit, there are merely context clauses.

The entity declaration includes port declarations which are in lines 5 to 9. Ports may be pins on ICs or any other edge connection on a board etc. Technically ports are signals and so signals and ports are read in the same way. The port declaration includes the name of each port, the direction in which information is allowed to flow through the ports and the data type of the ports as described above. The entity declaration is completed by the VHDL word "end". "A" is therefore an input and "F" an output.

The architecture body, which is in lines 10 to 13, represents the internal behaviour and structure of the design entity and is itself given an arbitrary name, in this case V1. The VHDL word "begin" signifies the start of the architecture statement part. The next line, line 12, is a concurrent signal assignment which describes how the design entity will actually function. This line of code is executed each time the input changes value after a time T which can be defined elsewhere. In the case of an inverter the output F is defined as being equal to NOT the input A. The architecture word "end" is used to complete the architecture declaration. The final VHDL comment on line 14 signified by /* is again merely a memory aid.

VHDL can be used to describe more complicated cells.

Figure 2:
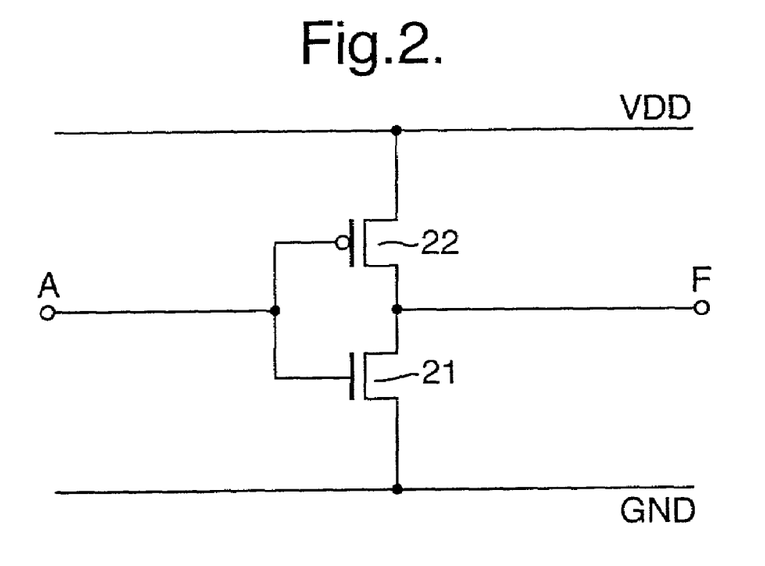
FIG. 2 illustrates an inverter logic gate as modelled by an analog model.

FIG. 2 shows how an ELDO Spice analog simulator might function to model the same inverter. The analog model includes an input A and an output F similar to the VHDL model. However the analog model describes the function of the analog inverter in relation to the transistors 21 and 22 which are arranged in a conventional inverting array. It will be appreciated that analog simulators can model analog voltage sweeps which are not available to the digital level VHDL models. That is the analog simulator can model voltages between the "0" and "1" levels. A portion of the program code which is executed by the analog model is set out below:

1. .subckt INV A F
2. M1 VDD A F PMOS
3. M2 GND A F NMOS
4. .ends

The first line defines a sub circuit which is named INV having an input A and output F. Once again the name is arbitrarily fixed by the programmer. The order in which the ports are listed defines the connectivity. "A" is an output and "F" is an output.

The next two lines, lines 2 and 3, define operation of the parts of the circuit. The parts are listed and comprise M1 (transistor 22) and M2 (transistor 21) which are defined as PMOS and NMOS transistors respectively. The drain, gate and source of transistor M1 are defined as being connected to Vdd, A and F respectively whilst those of M2 are connected to ground GND, A and F respectively. Once again an end-type message on line 4 defines the end of the functional description of the model. The ELDO program includes a library containing details of circuit components, resistors, capacitors transistors etc and includes details of their behaviour.

The relationship with the rest of the circuit can be defined as X1 net1 net70 INV. This indicates that input A is connected to net1 and output F is connected to net70 by an inverter. net1 and net70 represent a net list of the respective components or cells connected to the input A and the output F respectively.

By describing the inverter in terms of the two transistors 21 and 22 in this way, the analog model unlike the digital VHDL model above-described, is able to provide the tool with the functionality to allow it to work with real data types including floating point data type and voltage sweeps. This enables information to be learned about the transitional phases (i.e. where the voltage is between "0" and "high") as the input signal changes from low to high and vice versa. It will be appreciated that whilst such a simulation provides a highly accurate description of the circuit's performance it increases the complexity of the model which consequently takes far longer in run time.

As a consequence digital modelling is typically used, especially where the device design being tested includes large quantities of hardware cells. Verification between the cells response in a true analog simulator (ELDO) and its response in the VHDL model is therefore made. This is because without this verification, a cell which is tested using the quicker VHDL model may be found to be inoperational when using real data types.

One way in which the need for a model writer to make such a verification may be obviated is described in UK 9925656.2 which is incorporated herein by reference. Described therein is a way of automating the verification process as far as possible. A program or tool is provided which identifies an inaccurate digital model of a hardware circuit by simulating the model of the circuit by applying a plurality of signals (having at least one abstract data type level as described above with respect to the IEEE 1164 package) to the modelled cell. The result is a set of expected results. Each abstract data type level is then replaced with two or more levels having different values to thus provide an expanded set of signals which can be applied to the model. Having applied the expanded set to the model and noting the results the two sets of results are compared. If the results contradict, ie they are not identical or equal the model is inaccurate. There is therefore no comparison made of the results from an analog model and a digital model. Rather only the digital model is tested to see if it is operating correctly. Furthermore a problem occurs with such a tool when in order to model a hardware cell mixed signal types are required. In other words when the model must support the standard logic package and real data types as described above. Such a cell could be an analog to digital converter (ADC) or digital to analog converter (DAC).

Figure 3:
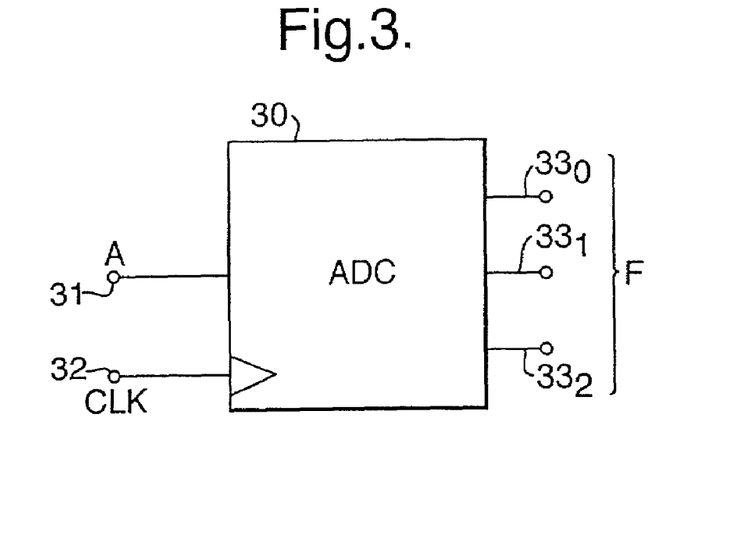
FIG. 3 illustrates a 3 bit ADC.

An embodiment of the present invention which allows a verification tool to handle both data types and to make a comparison between the outputs from an analog model and digital model of a hardware cell will now be described with reference to FIG. 3 which illustrates an ADC. The ADC 30 of FIG. 3 has a data input 31 through which data can be entered. This forms the analog input A to the ADC. The ADC is clocked via a clock input 32 and has three outputs $33_{0-2}$ which together form the digital output F from the ADC. An ADC functions by converting an analog input signal (for example in the form of a voltage sweep) into a digital output (for example in the form of a bit sequence).

Figure 4:
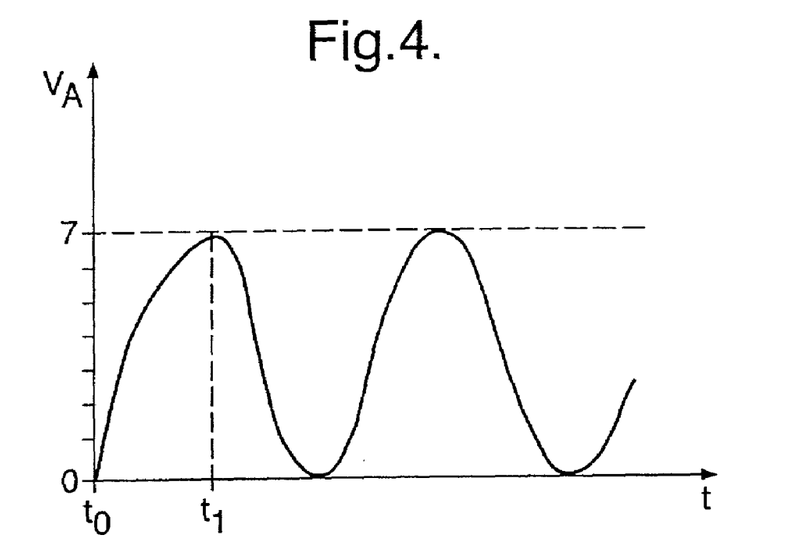
FIG. 4 illustrates an input signal to the ADC of FIG. 3.

FIG. 4 illustrates a possible input into the ADC. The input voltage $V_A$ is the voltage input at the data input 31 of the ADC and by way of example sweeps in a sinusoidal manner between 0 and 7 volts. It will be understood that any other form of input can be supplied which is of an analog nature ie not merely having discrete values such as floating point values which can have a fractional part. The values of 0 to 7 volts is typical of the limited voltage range of silicon which results in fairly small voltages being used in any hardware cell which is to be simulated.

Table 1 below illustrates the output from the ADC as the input varies from time $t_0$ to $t_1$.

TABLE 1

| Output from ADC OUTPUT | | |
|---|---|---|
| $33_2$ | $33_1$ | $33_0$ |
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

As shown in Table 1 the three outputs $33_{0-2}$ represent the least, medium and most significant bits respectively by which the output F can represent the voltage sweep from 0 to 7 volts. Initially at time $t_0$ the input voltage $V_A$ is 0 volts which results in a digital output consisting of the three bits <000>. As the voltage sweep increases to its maximum value of 7 volts at time $t_1$ the output is represented by the bit pattern <111> which represents the number 7 in standard binary format. Intermediate values are also provided for as shown in FIG. 4 and Table 1 above. The digital output increases or decreases in a stepped fashion as the input voltage sweeps through corresponding threshold voltages.

In order to model this circuit using a digital model for example a VHDL model a problem arises because of the input of the ADC is an analog signal whilst the output is a digital signal. Any model of the ADC must therefore be able to handle mixed signal types. In order to overcome this a user of a modelling tool would write an ASCII file of the form set out below. This instructs the modelling tool to model the analog to digital converter and provides input signals and timing sequences together with instructions to enable the model to simulate operation of the ADC.

| Objects | | |
|---|---|---|
| /ADC/A | : 1 REAL | |
| /ADC/CLK | : 1 std_logic | |
| /ADC/F | : 0 std_logic_vector 2 0 | |
| End | | |
| 0 ns | 0.0 | 0 |
| 5 ns | 0.0 | 1 |
| 10 ns | 1.0 | 0 |
| 15 ns | 1.0 | 1 |

The VHDL modelling tool reads this into its memory. Firstly the cell name, ADC, is read in then the pins are defined. In this case there are two inputs, A and CLK, and one output F. I is used to indicate an input whilst O presents an output.

The first input A is defined as being of the real type. The VHDL real type is a floating point representation which can be used for representing analog models. A floating point number is a real number, that is a number which may include a fractional part for example 4.0 or −86.7. In order to represent such numbers computers require complicated codes because they are inherently integer machines. The tool uses the atof ( ) C function to convert the ascii "[0–9]+(. [0–9]+)?" string into the C compilers internal representation. The IEEE standard may be more of a specific for hardware behaviour ie ÷ by 0 etc.

As opposed to fixed point numbers which always have the decimal point in the same position (for example binary numbers), floating point numbers have no fixed number of digits before or after the decimal point. Floating point numbers can be expressed in the form:

$$X=(-1)^{\hat{}}(S \times N \times 2)^{\hat{}}(E-B)$$

Here X is the value of the floating point number, S, the sign, is 0 or 1; N is the value of the significand; E is the value of the exponent and B is the exponent bias. This is well known in the art.

The second input CLK is defined as being of the standard logic type as described hereinabove. The output F is also defined as a standard logic type although it is expressed in vector format. In other words the output is expressed as a vector of three bits beginning with bit 0 and including two further bits.

The levels of signals are defined below the end statement. Initially at 0 ns the input A is 0.0 and the clock signal is low. After 5 ns the input remains at 0.0 but the clock signal becomes high, represented by 1. After a further 5 ns the input A is 1.0 whilst the clock signal is low. Although the first four entries only in the data field are shown it will be understood that input, clock and timing signals can be defined for the whole of a voltage sweep in this manner. Thus although the data input A is only indicated as 0.0 and 1.0 it will be understood that intermediate values from 0.0 to 7.0 would be required to model the ADC of FIGS. 3 and 4.

The tool which provides a VHDL model of the ADC reads these inputs in the timing sequence for the signals on the pins A and CLK. They are read in as time units of 5 ns together with a conversion rate of 1×10⁻⁹. This enables a comparison of the values to be made when the values themselves may be originally expressed in different units.

The output bit vectors from the VHDL model are shown in Table 2 together with a set of results from an analog model of the same hardware cell. These results will be described hereinafter.

TABLE 2

VHDL and Analog Model Outputs

| INPUTS | | | VHDL output | ANALOG output |
|---|---|---|---|---|
| 0 ns | 0.0 | 0 | XXX | XXX |
| 5 ns | 0.0 | 1 | 000 | 001 |
| 10 ns | 1.0 | 0 | 000 | 001 |
| 15 ns | 1.0 | 1 | 001 | 010 |

As illustrated the initial output from the VHDL model results in three XXX. These represent unknown quantities. This is because the clock signal has not yet signalled from a sample to be taken from the input and consequently any entry may be in existence. After 5 ns the clock indicates for the input, which still represents 0.0 volts, to be sampled. The digital model outputs the 3-bit vector (000) accordingly.

In the example after another 5 ns the input A is 1.0 (it will be understood that this could be any other value such as 0.2, 1.1 etc but is shown merely as an example). At this stage however the value is not sampled because the clock signal is low. Consequently the output from the VHDL model remains (000). After a further 5 ns, ie after 15 ns, the clock signal becomes high and the VHDL model simulates the ADC hardware cell with the input 1.0. The output F stores (001) accordingly. A similar process is repeated for a long period of time thereby modelling an ADC cell with an analog voltage input. The output is a set of simulation results which comprises a list of 3-bit vectors which indicate chronologically the digital equivalent of the analog input signal.

Since the VHDL model is a digital model the results accurately reflect what performance a system designer would wish for from an ADC hardware cell.

This is of course slightly different from an analog model of the same hardware cell which will actually model what will happen in an ADC. Due to inaccuracies between the model represented by the digital model and the way a circuit will in reality work, represented by the analog model, slight differences between the results of the two models may exist. These differences may of course be due to errors or inaccuracies in the models. Also they will often be due to the variations in the models caused by the analog model accurately modelling propagation of real signals through silicon etc. As will be appreciated this is often less than ideal.

As seen in Table 2 the results of an analog model of the same ADC in response to the imaginary inputs having the chronological timing sequence shown may vary slightly from those of the digital model.

As shown at time 0 ns the output from an analog model will be unknown because the clock signal 32 is low indicating that the input to the ADC should not be sampled. The output from the model will therefore be dependent upon the values preexisting in the model. At time 5 ns the rising edge of the clock pulse drives the input 0.0 V into the ADC model. Under these conditions the VHDL model outputs a <000> as one would expect. However in the example shown the analog model outputs <001>. This may be due to component tolerances, different operating conditions (ie voltage or temperature) or loosely specified designs (to reduce cost). Although in the particular example shown the difference between a 0 volts input and an output indicating a 1 seems extreme it is shown for illustration only. The skilled man will understand that a similar discrepancy could occur in many situations particularly when the input voltage was approximately equal to a threshold voltage. In such a case one model would output a value representing an old result whilst the other model might advance to the next value.

Since the clock pulse at time 10 ns is low no new input is driven into the ADC model and consequently the output remains at <001>.

After 15 ns the rising edge of the clock pulse drives the 1.0 volts input into the ADC model. At this juncture one would expect, as indicated by the digital model, the output from the ADC model to be <001> representing an output of 1 resulting from an input of 1. On many occasions the output from an analog will be identical to the output from the digital model but by way of example Table 2 shows another occasion when the analog model input is rather different from the expected value. The output from the analog model will provide a second set of simulation results. The entries in the set of results correspond to a chronological sequence of the output of the model.

Now if a check is required to verify that each model accurately describes the ADC cell a comparison of the results from each model is made. For the results after 5 ns the VHDL model outputs a <000> whilst the analog model outputs a <001>. Therefore by making a strict comparison between the two results the check will indicate that at least one of the models is inaccurate because the results are not identical and the test will fail.

This will likewise be the situation with the results after 10 and 15 ns when a <000> and a <001> will be compared with <001> and <010> respectively. Any of these comparisons would indicate a lack of correspondence between the two models resulting in a fail.

One problem with this situation is that the comparison is strict in the sense that if the two models provide non-identical results the test fails. This occurs even when, as in the example described, the two results are only slightly unidentical. In fact as described above it will sometimes be the case that the two models provide slightly different results due to the fact that the digital model simulates what is expected whilst the analog models simulates what in fact would occur.

One way to overcome this problem is to introduce a tolerance into the comparison step. For example each result from the analog model could be compared with a range of results based upon the corresponding result from the digital model. Providing the analog result was within the range of results provided by adding and subtracting a tolerance value to/from the actual digital result the test could pass.

However when the outputs of the cell being modelled are in binary format a bit accurate comparison is difficult.

Table 3 illustrates binary numbers and their integer values together with other details which will be described hereinafter.

TABLE 3

Binary values and their integer representations

| BINARY | Unsigned | Signed | One's Comp | Two's Comp |
|---|---|---|---|---|
| 0000 | 0 | 0 | 0 | 0 |
| 0001 | 1 | 1 | 1 | 1 |

TABLE 3-continued

Binary values and their integer representations

| BINARY | Unsigned | Signed | One's Comp | Two's Comp |
|---|---|---|---|---|
| 0010 | 2 | 2 | 2 | 2 |
| 0011 | 3 | 3 | 3 | 3 |
| 0100 | 4 | 4 | 4 | 4 |
| 0101 | 5 | 5 | 5 | 5 |
| 0110 | 6 | 6 | 6 | 6 |
| 0111 | 7 | 7 | 7 | 7 |
| 1000 | 8 | −0 | −7 | −8 |
| 1001 | 9 | −1 | −6 | −7 |
| 1010 | 10 | −2 | −5 | −6 |
| 1011 | 11 | −3 | −4 | −5 |
| 1100 | 12 | −4 | −3 | −4 |
| 1101 | 13 | −5 | −2 | −3 |
| 1110 | 14 | −6 | −1 | −2 |
| 1111 | 15 | −7 | −0 | −1 |

As can seen the numbers representing 0 and 1 in binary <0000> and <0001> respectively, are only different by one bit. Thus a comparison of the two digital numbers each representing the outputs from an analog or digital model with a tolerance of 1 bit would be sufficient for a verification check of the two models to pass. However if the outputs from the analog and digital models are 7 and 8 ie <0111> and <1000> in binary a bit accurate comparison would indicate four different bits. As a result even though the absolute values 7 and 8 from the two models are very similar a comparison of the binary equivalents would indicate a great disparity in the results. Any test verifying that the two models produced the same results would fail even though the models in fact produced very similar values well within the ranges of errors which could occur naturally as a result of the differences in analog and digital modelling strategies.

In order to overcome this embodiments of the present invention first translate the binary results from the ADC models into an integer representation. In this way <0111> is represented by 7 and <1000> is represented by 8. These integer representations can then be compared together with a tolerance factor. The integer representations themselves are provided as floating point values which enables a tool to compare the values.

In other words because an analog model is never going to be 100% accurate to an ideal VHDL model the tool has to allow both real signals and binary conversions of the logic vectors output from a cell, a specific deviation from the ideal case. This deviation is specified as a tolerance. In addition to the tolerance there could be other effects which need handling such as circuit gain and, in the case of binary representations, the conversion method used. Any toleranced value will be converted to a real number representation using one of a number of possible conversion methods as described hereinbelow. It is then the real representation that is used for the tolerance verification. Because of this a toleranced bus is omitted from the normal bit accurate verification. A number of conversion techniques can be utilised. The most common of these are listed below although the skilled person will understand that any alternative conversion method could be used.

Unsigned

This can only represent positive values. The binary number is converted to a decimal using a binary to decimal conversion. The converted number will be one of 0, 1, 2, 3 . . . etc up to $2^m-1$ where m is the number of bits. For example an 8 bit bus will contain 256 values from between 0 to 255.

Signed

This can represent both positive and negative numbers using the most significant bit as a sign bit. If the number is positive the sign bit is 0 and if the number is negative the sign bit is 1. This conversion method is also known in the art as sign magnitude. For an 8 bit bus the values that can be represented are between $-2^{m-1}+1$ to $+2^{m-1}-1=-127$ to $+127$.

One's Complement

This is similar to the signed representation but for negative numbers in addition to the sign bit being set to 1 the least significant bits are inverted.

Two's Complement

This is like One's Complement. However for negative numbers 1 is added to the One's Complement representation.

In order to carry out such a conversion the tool which carries out the conversion must have one of the techniques specified in its code. A comment is therefore used to specify the bus name and its conversion method for use in tolerance checking. In particular one of the following lines is added as appropriate to the code.

--CONVERSION=data unsigned
--CONVERSION=data signed
--CONVERSION=data One's Comp
--CONVERSION=data Two's Comp It is preferred that no default setting is specified because an error in the conversion mechanism is hard to detect. By having no defaults the user is forced to provide a correct mechanism.

Some scaling may in fact be necessary in addition to tolerancing to enable the results from an analog model of a hardware cell to be effectively compared with the results from a digital model. In this sense the results from the analog model ELDO are stored as a set of comparison results whilst the results from the digital VHDL model are modified into a set of results which can thereafter be compared on a like-by-like basis.

To allow for the conversion effect the real or binary converted value of the ideal VHDL model can be scaled and offset. These two effects are given a special command line in the code that also sets the allowable tolerance on the final values as absolute values. The syntax of this line is given below.

--TOLERANCE=object offset gain plus minus

Here object is the object name. For a DAC this will be an output having a real type. For an ADC this will be a vector converted to an integer as described above.

Offset is an expected offset which may occur between the two models of the hardware cell. The value is likely to be set to zero. The VHDL value has this offset added to it after it has been multiplied by the gain.

Gain is an expected normal multiplicative factor which can be required, particularly in the case of a DAC where one model, say the analog model indicates an accurate output from the cell, say 3 mV, whilst the digital model outputs only a quantative value say 3. In this case a multiplicative factor of $1 \times 10^{-3}$ must be introduced to enable the final values to be compared.

Plus represents the largest positive tolerance allowed. This sets the positive deviation from the VHDL model value that the corresponding result from the ELDO model can have which will still result in a pass.

Minus is the opposite of plus and represents the largest negative tolerance allowed. This sets the maximum negative deviation from the VHDL value that a corresponding ELDO model result can have without the verification tool indicating a fail. The minus factor can be of similar magnitude to plus or can be greater or lesser in value.

In summary the results from an ELDO (analog) model of a hardware cell are stored as a set of results. This set of results includes simulation results representing performance of the cell over an imaginary period of time. The results from a VHDL (digital) model of the cell are also stored as a set of results. This set of results also includes simulation results representing performance of the cell over the same period of time. This set of results from the VHDL model are then modified using the gain, offset, plus and minus features set out above.

In this way each result in the set of results from the digital model is modified to provide a corrected result. This corrected value is obtained by multiplying the result from the VHDL model by the gain and then adding the offset to the total. A range of acceptable values for the ELDO simulation is then defined between the lower value $V_{MIN}$, formed by subtracting the factor minus, and the upper value $V_{MAX}$ formed by adding the factor plus. If the ELDO value $V_{ELDO}$ is in the range $$V_{MIN} \geq V_{ELDO} \leq V_{MAX}$$

then the result from the two models simulated are sufficiently close to assume that the models are accurate. Any disparity between results is thus due to acceptable minor differences because of the different manner in which the two models simulate a hardware cell. It will be understood that rather than modifying the results from the VHDL mode the ELDO simulation results could be modified and then those modified results could be compared with the unmodified VHDL model results.

Any other tolerancing calculation could be used, for example non linear tolerancing which would enable handling of $\mu$LAW and A LAW converters.

It should be appreciated that embodiments of the present invention may be implemented by a computer program or by suitable circuitry. The various circuits described can be implemented in hardware or software. When the verification process has been completed an output signal is provided which indicates if the test has been successful or has failed.

The output of embodiments of the invention provides an indication to a user, for example, on a screen indicating that a test has failed or passed. Optionally, in the case of failure, an explanation as to the cause of failure is provided. The output may also advise the computer operating system if the test has passed and failed. In a preferred embodiment of the invention, a file is created in the operating system which indicates if a test has passed or failed. In the case of failure, the reasons for the failure are written in the file.

As an alternative to VHDL, Verilog or C can be used.

Embodiments of the present invention can be used to verify models of part or all of an integrated circuit.

It will be apparent to those skilled in the art that modifications could be made to the above-described examples without departing from the scope of the present invention.

The invention claimed is:

1. A computer-implemented method of identifying an inaccurate model of a hardware circuit comprising the steps of:
    simulating a digital model and an analog model of the circuit to provide first and second sets of binary simulation results respectively;
    translating each binary result in the first and second sets of binary simulation results determining into an integer value representing that binary result and storing the integer values in first and second sets of comparison results respectively;
    comparing the sets of comparison results; and
    providing an output signal indicating that at least one of the models is inaccurate if the comparison results contradict.

2. A method according to claim 1 wherein said step of simulating a digital model comprises the steps of:
    applying at least one input signal having a first signal type, to an input of the model;
    outputting at least one output signal, having a second signal type, from an output of the model; wherein
    said input and output signal are mixed signal types, one of the signal types being a digital signal and the other signal type being an analog signal.

3. A method according to claim 1 further comprising the steps of:
    prior to said step of comparing results modifying the integer values in the first set of comparison results by introducing a tolerance factor to the integer value to thereby obtain a respective maximum and minimum acceptance value;
    for each integer value, defining a range of acceptable results between the maximum and minimum acceptable value and storing these ranges as a set of toleranced results;
    comparing range results in the set of toleranced results with corresponding results in the second set of comparison results; and
    providing the output signal according to whether a result in the second set of comparison results falls within its corresponding range from the set of toleranced results.

4. A method according to claim 3 wherein said step of modifying the integer values in the first set of comparison results comprises adding a tolerance factor to and subtracting the tolerance factor from the integer value.

5. A method of claim 3 further comprising the steps of:
    prior to said step of comparing results, modifying the integer values in the first set of comparison results by adding a correction factor to each value;
    comparing results in the modified set of comparison results with corresponding results in the second set of comparison results; and
    providing the output signal if the modified set and second set of results contradict.

6. A method according to claim 1, wherein said step of translating each result into an integer value comprises:
    converting each binary result into an integer value according to a predetermined conversion technique.

7. A method according to claim 6 in which the conversion technique comprises an unsigned or signed or one's complement to two's complement conversion.

8. A method of claim 1 wherein the digital model is an HDL model.

9. A method of claim 1 wherein the analog model is an ELDO model.

10. A computer program product comprising a computer readable medium having thereon computer program code means for performing the steps of claim 1 when the program code is executed on a computer.

11. A computer-implemented method of identifying an inaccurate model of a hardware circuit comprising the steps of:
    simulating a digital model and an analog model of the circuit to provide first and second sets of binary simulation results respectively;

translating each binary result in the first and second sets of binary simulation results into an integer value representing that binary result and storing the integer values in first and second sets of comparison results respectively;

for one of said sets of comparison results introducing a tolerance factor to provide a set of toleranced results;

comparing the set of toleranced results with the other set of comparison results; and providing an output signal indicating that at least one of the models is inaccurate if the comparison step indicates the values of the other set of comparison results and the toleranced results contradict.

12. A method of claim 11 wherein the digital model is an HDL model.

13. A method of claim 11 wherein the analog model is an ELDO model.

14. A system identifying an inaccurate model of a hardware circuit comprising:

means for simulating a digital model of the circuit and an analog model of the circuit to provide first and second sets of binary simulations results respectively;

means for translating each binary result in the first and second sets of simulation results into an integer value representing that binary result, means for storing said integer values as first and second sets of comparison results respectively;

means for comparing the sets of comparison results; and means for providing an output signal indicating that at least one of the models is inaccurate if the comparison results contradict.

15. A system according to claim 14 wherein the system is a computer system.

16. A system for identifying an inaccurate model of a hardware circuit comprising:

means for simulating a digital model and an analog model of the circuit to provide first and second sets of simulation results respectively;

means for translating each binary result in the first and second sets of simulation results into an integer value representing that binary result, means for storing said integer values as first and second sets of comparison results respectively;

means for, for one of said sets of comparison results introducing a tolerance factor to provide a set of toleranced results;

means for comparing the set of toleranced results with the other set of comparison results; and means for providing an output signal indicating that at least one of the models is inaccurate of the comparison step indicates the values of the other set of simulation results and the toleranced results contradict.

17. A system according to claim 16 wherein the system is a computer system.

* * * * *